United States Patent [19]
Tzu

[11] Patent Number: 6,093,507
[45] Date of Patent: Jul. 25, 2000

[54] SIMPLIFIED PROCESS FOR FABRICATING LEVINSON AND CHROMELESS TYPE PHASE SHIFTING MASKS

[75] Inventor: San-De Tzu, Taipei, Taiwan

[73] Assignee: Taiwan Semiconductor Manufacturing Company, Hsin-Chu, Taiwan

[21] Appl. No.: 09/225,381

[22] Filed: Jan. 4, 1999

[51] Int. Cl.[7] ................................. G03F 9/00
[52] U.S. Cl. ................... 430/5; 430/323; 430/394
[58] Field of Search ................ 430/5, 322, 323, 430/324, 296, 394

[56] References Cited

U.S. PATENT DOCUMENTS

| | | | |
|---|---|---|---|
| 4,935,334 | 6/1990 | Boettiger et al. | 430/322 |
| 5,413,884 | 5/1995 | Koch et al. | 430/5 |
| 5,582,939 | 12/1996 | Pierrat | 430/5 |
| 5,604,081 | 2/1997 | Stoll | 430/5 |
| 5,753,417 | 5/1998 | Ulrich | 430/5 |
| 5,759,724 | 6/1998 | Rolson | 430/5 |
| 5,780,188 | 7/1998 | Rolson | 430/30 |
| 5,783,337 | 7/1998 | Tzu et al. | 430/5 |
| 5,853,923 | 12/1998 | Tzu | 430/5 |

OTHER PUBLICATIONS

Takahashi et al., "Primary Processes in E–Beam and Laser Lithographies for Phase–Shift Mask Manufacturing", SPIE vol. 1674, Optical/Laser Microlithography V (1992), pp. 216–229.

Kurihara et al., "Primary Processes in E–Beam and Laser Lithographies for Phase–Shift Mask Manufacturing II," 12th Annual Bacus Symposium SPIE vol. 1809 (1992), pp. 50–61.

*Primary Examiner*—S. Rosasco
*Attorney, Agent, or Firm*—George O. Saile; Stephen B. Ackerman; Larry J. Prescott

[57] ABSTRACT

A method is described of forming phase shifting masks using a single layer of resist and a single electron beam exposure step with two different exposure doses. A layer of resist is formed on a layer of opaque material formed on a transparent mask substrate. A first pattern is exposed in the entire thickness of the layer of resist, using a first exposure dose, and a second pattern is exposed in the top portion of the layer of resist, using s second exposure dose smaller than the first exposure dose. The layer of resist is then developed and baked. The first pattern in then etched in the layer of opaque material and a first thickness of the transparent mask substrate. The first thickness of the transparent mask substrate provides a 180° phase shift to light used to transfer the mask pattern to an integrated circuit wafer. Part of the layer of resist is then etched away transferring the second pattern to the resist that remains. The second pattern is then etched in the layer of opaque material. The remaining resist is then stripped and the mask is completed.

21 Claims, 3 Drawing Sheets

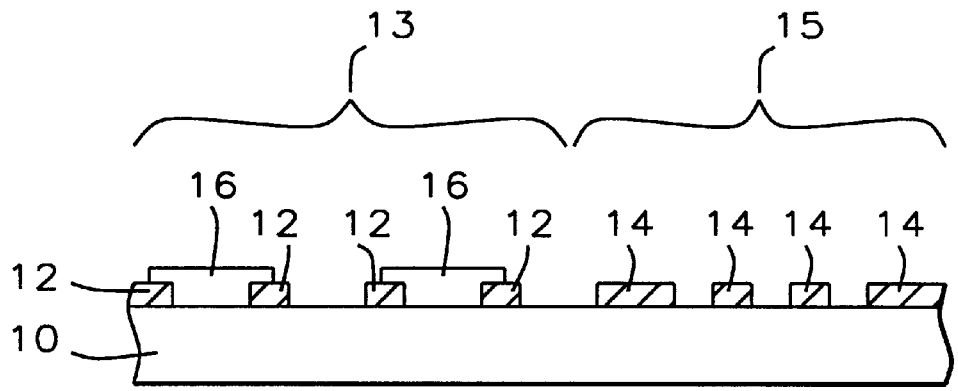
FIG. 1 - Prior Art
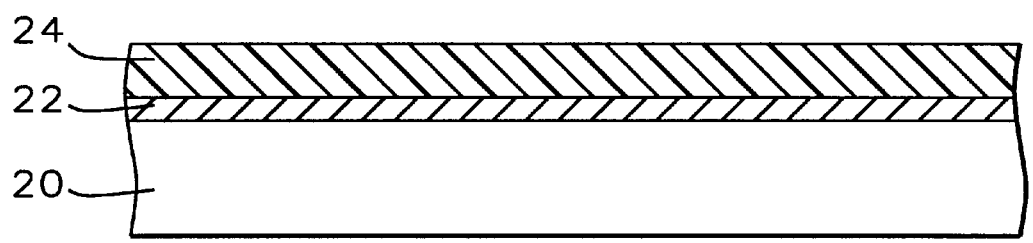
FIG. 2
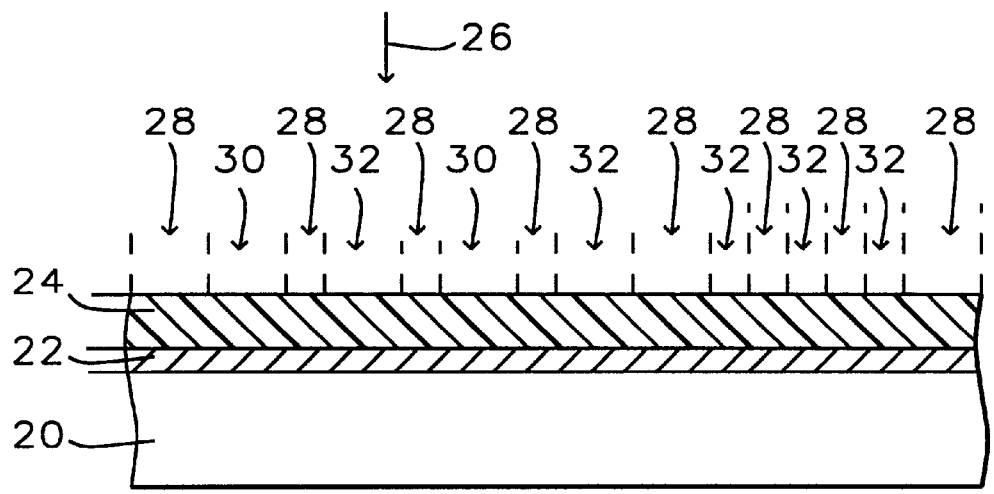
FIG. 3

SIMPLIFIED PROCESS FOR FABRICATING LEVINSON AND CHROMELESS TYPE PHASE SHIFTING MASKS

BACKGROUND OF THE INVENTION (1) Field of the Invention

This invention relates to a simplified method of forming phase shifting type masks and more particularly to a method of forming phase shifting type masks using a single resist layer with two exposure doses.

(2) Description of the Related Art

Phase shifting masks provide a significant improvement in process margin for the fabrication of integrated circuit wafers. Light projected through the masks expose a layer of photoresist formed on the integrated circuit wafer. The phase shifting masks have phase shifting material to shift the phase of the light at the edge of pattern features, usually by 180°. This shift in phase causes beneficial interference at the edge of pattern features and improves feature definition.

U.S. Pat. No. 4,935,334 to Boettiger et al. describes a method of forming a photoresist pattern from a mask. The photoresist pattern can have different wall profiles than the mask pattern used to form the photoresist pattern.

U.S. Pat. No. 5,780,188 to Rolson describes a system for exposing a layer of resist on a semiconductor wafer. The layer of resist is exposed in multiple stages. During each stage the target can be exposed through unequal stepping distances.

U.S. Pat. No. 5,783,337 to Tzu et al. describes a method for forming attenuating phase shifting masks. A transparent mask substrate has a layer of phase shifting material formed thereon and a layer of chrome attenuating phase shifting material formed on the layer of phase shifting material. A layer of resist is formed on the layer of chrome. The layer of resist is exposed using two different exposure levels to pattern the layer of phase shifting material and the layer of chrome attenuating phase shifting material.

U.S. Pat. No. 5,759,724 to Rolson describes a method of forming multi-phase phase shifting masks.

U.S. Pat. No. 5,413,884 to Koch et al. describes a method of using a direct-write electron beam process to form rectangular grating teeth in a mask substrate. The mask is then used as a phase mask to transfer the pattern to an optoelectronic device.

U.S. Pat. No. 5,582,939 to Pierrat describes a method of forming defect-free phase shift masks.

A paper entitled "Primary Process in E-Beam and Laser Lithographies for Phase-Shift Mask Manufacturing", by Takahashi et al., SPIE Vol. 1674, Optical/Laser Microlithography V (1992), pages 216–229 discusses two lithographic processes for phase-shift mask manufacturing.

A paper entitled "Primary Process in E-Beam and Laser Lithographies for Phase-Shift Mask Manufacturing. II", by Kurihara et al., SPIE Vol. 1809 12th Annual BACUS Symposium (1992), pages 50–61 discusses two lithographic processes for phase-shift mask manufacturing.

SUMMARY OF THE INVENTION

While phase shifting masks improve feature definition and process latitude they are more complex to design and fabricate. The patterns are usually formed on a mask substrate using opaque material and phase shifting material. FIG. 1 shows a cross section of a conventional phase shifting mask having both phase shifting regions 13 and binary regions 15. In the binary region 15 a pattern of opaque material 14, such as chrome is formed on a transparent mask substrate 10. In the phase shifting region 13 a pattern of opaque material 12, such as chrome, and a pattern of phase shifting material 16 are formed on the transparent mask substrate. Typically a separate layer of resist is required to pattern the opaque material, 12 and 14, and a separate layer of resist is required to pattern the layer of phase shifting material 16. The use of multiple applications of resist requires multiple exposure and multiple development of the resist to achieve the proper patterns of both opaque and phase shifting material. This increases the complexity and the cost of mask fabrication and limits their application.

It is a principle objective of this invention to provide a method of forming phase shifting masks which require only one resist application which can be exposed by a single electron beam using different exposure doses.

This objective is achieved by forming a layer of resist on a layer of opaque material formed on a transparent mask substrate. The layer of resist is exposed with two different exposure doses using an electron beam. A first pattern is exposed through the entire thickness of the layer of resist using a first exposure dose. A second pattern is exposed in the top portion of the layer of resist using a second exposure dose, smaller than the first exposure dose. The layer of resist is then developed and baked forming the first pattern in the entire thickness of the layer of resist and the second pattern in the top portion of the layer of resist only. The first pattern in the entire thickness of the layer of resist exposes the opaque material.

The first pattern is then etched in the layer of opaque material by etching away the opaque material not covered by resist, thereby exposing the transparent mask substrate. The first pattern is then etched a first thickness into the transparent mask substrate again using the first pattern in the entire thickness of the layer of resist as a mask. The first thickness of the transparent mask substrate is that amount of the transparent mask substrate required to provide a 180° phase shift.

Part of the layer of resist is then etched away using anisotropic etching so that the second pattern is transferred to the remaining resist material exposing opaque material. The second pattern is then etched in the layer of opaque material by etching away the exposed opaque material. The resist is then stripped and the mask is complete.

BRIEF DESCRIPTION OF THE DRAWINGS

FIG. 1 shows a cross section view of a conventional phase shifting mask having both phase shifting regions and binary regions.

FIG. 2 shows a cross section view of a mask blank substrate having a layer of opaque material formed on a transparent mask substrate and a layer of resist formed on the layer of opaque material.

FIG. 3 shows a cross section view of the mask blank being exposed by an electron beam with two different exposure doses.

DESCRIPTION OF THE PREFERRED EMBODIMENTS

The method of this invention to form phase shifting masks using a single layer of resist will now be described in detail with reference to FIGS. 2–9. FIG. 2 shows a cross section view of a mask blank having a layer of opaque material 22, such as chrome or the like, formed on a transparent mask substrate 20. The transparent mask substrate 20 is formed of a material such as quartz. In this example the chrome has a thickness of between about 500 and 1000 Angstroms and the quartz mask substrate has a thickness of between about 5 and 8 millimeters. A layer of electron beam resist 24 is formed on the layer of opaque material 22.

Figure 4:
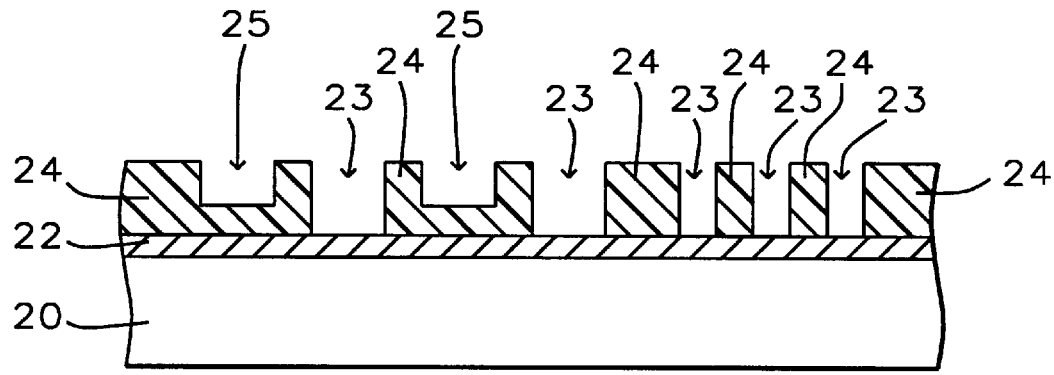
FIG. 4 shows a cross section view of a mask having a first pattern formed in the entire thickness of the layer of resist and a second pattern formed in the top portion of the layer of resist.

As shown in FIG. 3, the layer of resist 24 is then exposed using a single electron beam 26 with different exposure doses in different regions of the layer of resist. A LASER beam can be used in place of the electron beam. A first pattern region 32 is exposed using a first exposure dose which is sufficient to expose the entire thickness of the layer of resist 24. A second pattern region 30 is exposed using a second exposure dose, smaller than the first exposure dose, which is sufficient to expose only a top portion of the layer of resist. The remainder 28 of the layer of resist is not exposed at all with the electron beam 26. As shown in FIG. 4, the layer of resist 24 is then developed and baked thereby forming the first pattern 23 in the entire thickness of the layer of resist and the second pattern 25 in only the top portion of the layer of resist.

Figure 5:
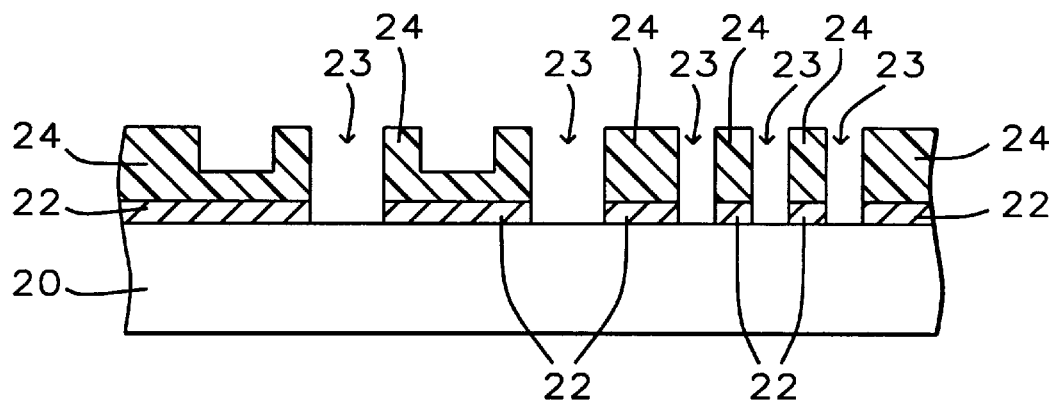
FIG. 5 shows a cross section of the mask after the first pattern has been etched in the layer of opaque material.

As shown in FIG. 5, the first pattern 23 is then etched in the layer of opaque material 22 using the first pattern in the layer of resist as a mask. In this example the layer of opaque material is chrome and the first pattern is etched in the layer of chrome using wet etching with an etchant of $(HClO_4/Cl(NH_4)_2(NO_3)_6$. The first pattern can also be etched in the layer of chrome using dry etching with $Cl_2+O_2$ as an etchant.

Figure 6:
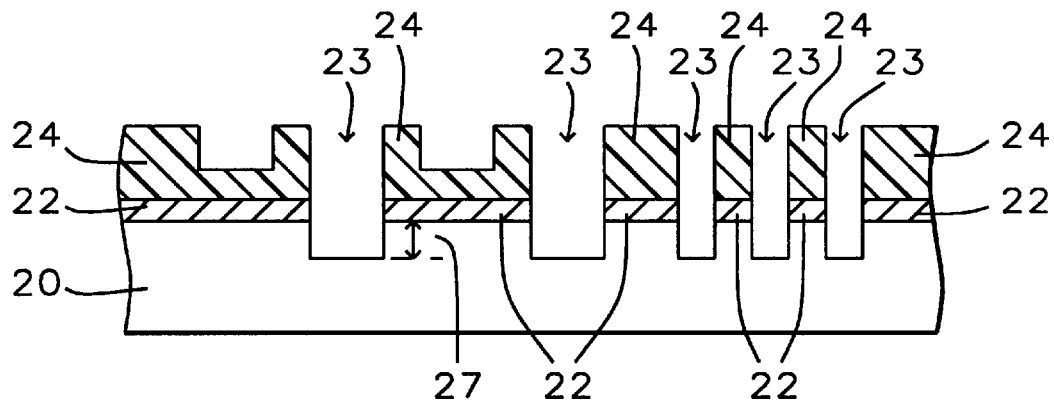
FIG. 6 shows a cross section of the mask after the first pattern has been etched a first thickness into the transparent mask substrate.
Figure 7:
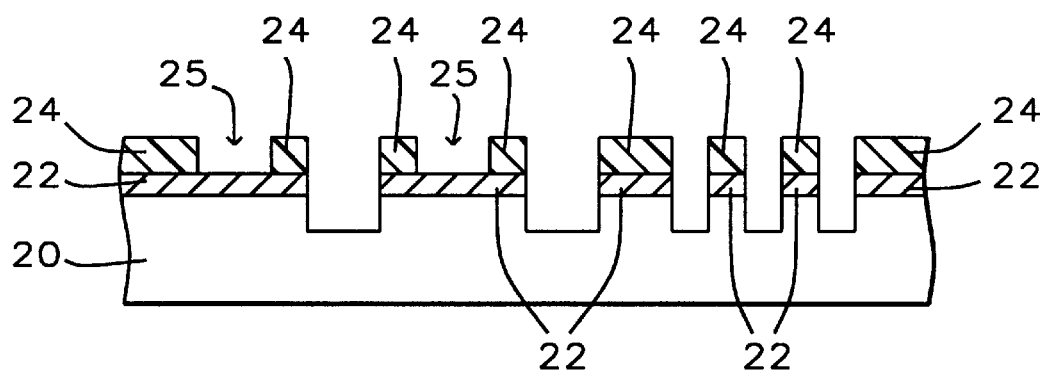
FIG. 7 shows a cross section of the mask after part of the layer of resist has been etched away transferring the second pattern to the remaining part of the layer of resist.
Figure 8:
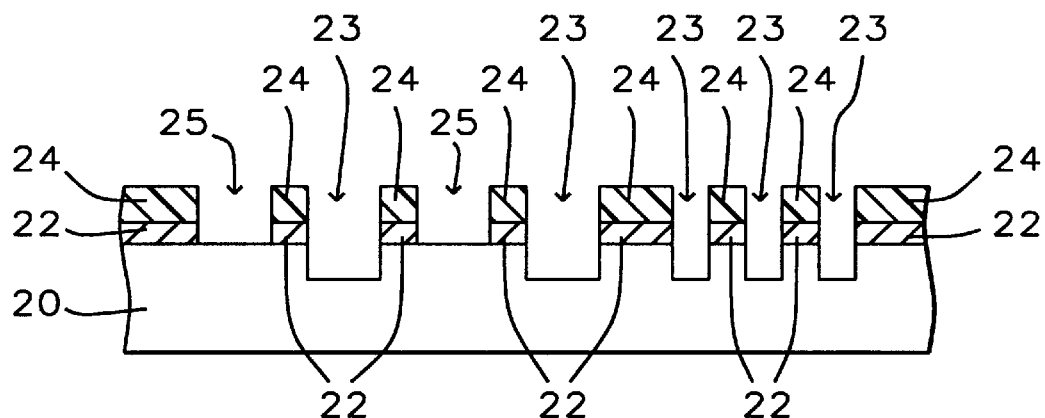
FIG. 8 shows a cross section of the mask after the second pattern has been etched in the layer of opaque material.

Next, as shown in FIG. 6, the first pattern is etched into the transparent mask substrate 20, in this example quartz, to a depth of a first thickness 27 using dry anisotropic etching and $CF_4+O_2$ or $CHF_3+He$ as an etchant. The first thickness of the transparent substrate material, in this example quartz, will provide a 180° phase shift for light having a wavelength of the light which will be used to project the completed mask pattern onto a layer of resist formed on an integrated circuit wafer. As shown in FIG. 7, the top part of the layer of resist 24 is then etched away using dry anisotropic etching with an $O_2$ plasma, thereby transferring the second pattern 25 to that part of the layer of resist which remains 24. As shown in FIG. 8, the second pattern 25 is then etched in the layer of opaque material 22, in this example chrome, using the second pattern 25 in the layer of resist as a mask and an etching means which will not etch the transparent mask substrate, in this example quartz, such as wet etching with an etchant of $(HClO_4/Cl(NH_4)_2(NO_3)_6$ or dry etching with an etchant of $Cl_2+O_2$.

Figure 9:
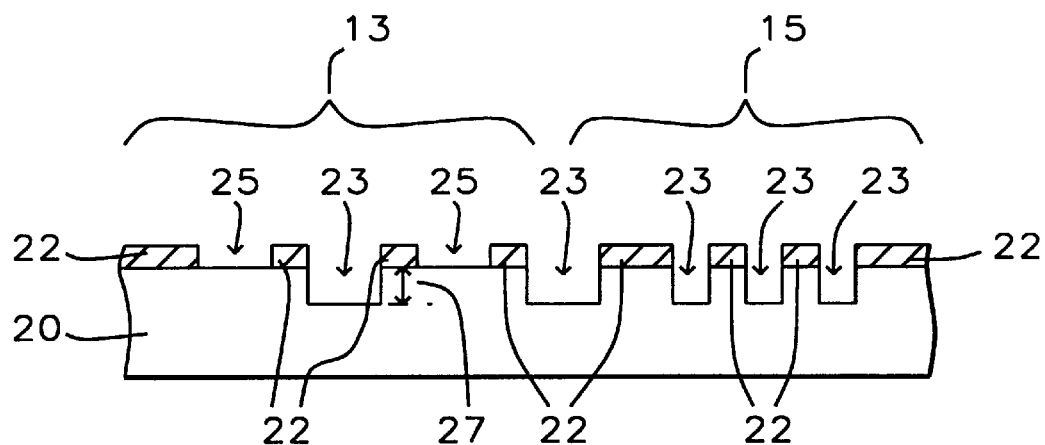
FIG. 9 shows a cross section of the mask after the remaining part of the layer of resist has been stripped and the mask has been completed.

Next, as shown in FIG. 9, the layer of resist is stripped and the mask is completed. When the mask is used to transfer the mask pattern to a layer of resist formed on an integrated circuit wafer, the light passing through the second pattern region 25 of the mask passes through an extra first thickness 27 of the transparent mask substrate 20 as compared to the light passing through the first pattern region 23 of the mask. This extra first thickness 27 of the transparent mask substrate 20 provides a 180° phase shift compared to the light which does not pass through the extra first thickness 27 of the transparent mask substrate 20.

As can be seen in FIG. 9, the mask shown in this example has both a phase shifting mask region 13 and a binary mask region 15. The mask performs the same function as the conventional mask shown in FIG. 1 but is fabricated using a single layer of resist, a single electron beam exposure step, a single resist development step, and a single resist baking step.

While the invention has been particularly shown and described with reference to the preferred embodiments thereof, it will be understood by those skilled in the art that various changes in form and details may be made without departing from the spirit and scope of the invention.

What is claimed is:

1. A method of forming phase shifting masks, comprising:

providing a mask substrate of transparent material, a layer of opaque material formed on said mask substrate, and a layer of resist formed on said layer of opaque material;

exposing a first pattern in the entire thickness of said layer of resist using a first exposure dose;

exposing a second pattern in a top portion of said layer of resist using a second exposure dose, wherein said second exposure dose is less than said first exposure dose;

developing said layer of resist thereby forming said first pattern in said entire thickness of said layer of resist and said second pattern in said top portion of said layer of resist;

etching said first pattern in said layer of opaque material using a first etching means and said first pattern formed in said entire thickness of said layer of resist as a mask;

etching said first pattern a first distance into said mask substrate of transparent material using a second etching means and said first pattern formed in said entire thickness of said layer of resist as a mask;

etching away part of said layer of resist using a third etching means thereby forming said second pattern in that part of said layer of resist that remains;

etching said second pattern in said layer of opaque material using a fourth etching means and said second pattern formed in that part of said layer of resist that remains as a mask; and removing the remaining said resist.

2. The method of claim 1 wherein said transparent material is quartz.

3. The method of claim 1 wherein said opaque material is chrome.

4. The method of claim 1 wherein said transparent material having a thickness equal to said first distance provides a 180° phase shift to light passing through said transparent material.

5. The method of claim 1 wherein said exposing a first pattern in said layer of resist and said exposing a second pattern in said top portion of said layer of resist uses an electron beam or a LASER beam.

6. The method of claim 1 wherein said first etching means uses wet etching with $(HClO_4/Cl(NH_4)_2(NO_3)_6$ as an etchant.

7. The method of claim 1 wherein said first etching means uses dry etching with $Cl_2+O_2$ as an etchant.

8. The method of claim 1 wherein said second etching means uses dry anisotropic etching with $CF_4+O_2$ or $CHF_3+$He as an etchant.

9. The method of claim 1 wherein said third etching means uses $O_2$ plasma dry anisotropic etching.

10. The method of claim 1 wherein said fourth etching means uses wet etching with $(HClO_4/Cl(NH_4)_2(NO_3)_6$ as an etchant.

11. The method of claim 1 wherein said fourth etching means uses dry etching with $Cl_2+O_2$ as an etchant.

12. A method of forming phase shifting masks, comprising:

providing a mask substrate of transparent material having a layer of opaque material formed thereon;

forming a layer of resist on said layer of opaque material, wherein said layer of resist consists of a top portion having a first thickness and a bottom portion having a second thickness, and said bottom portion of said layer of resist contacts said layer of opaque material;

exposing a first pattern in said top portion and said bottom portion of said layer of resist using a first exposure dose;

exposing a second pattern in said top portion of said layer of resist using a second exposure dose, wherein said second exposure dose is less than said first exposure dose;

developing said layer of resist thereby forming a first resist mask by removing that part of said top portion and said bottom portion of said layer of resist exposed by said first pattern and that part of said top portion of said layer of resist exposed by said second pattern;

etching said first pattern in said layer of opaque material using a first etching means and said first resist mask;

etching said first pattern a distance equal to a third thickness into said mask substrate of transparent material using a second etching means and said first resist mask, wherein said transparent material having a thickness of said third thickness provides a phase shift of 180° to light having a first wavelength;

etching away a fourth thickness of said layer of resist using a third etching means thereby forming a second resist mask by forming said second pattern in said bottom portion of said layer of resist, wherein said fourth thickness is equal to or greater than said second thickness and less than the sum of said first thickness and said second thickness;

etching said second pattern in said layer of opaque material using a fourth etching means and said second resist mask; and removing the remaining said resist thereby forming a phase shifting mask, wherein said phase shifting mask can be used with light having said first wavelength to pattern a semiconductor wafer.

13. The method of claim 12 wherein said transparent material is quartz.

14. The method of claim 12 wherein said opaque material is chrome.

15. The method of claim 12 wherein said exposing a first pattern in said top portion and said bottom portion of said layer of resist and said exposing a second pattern in said top portion of said layer of resist uses an electron beam or a LASER beam.

16. The method of claim 12 wherein said first etching means uses wet etching with $(HClO_4/Cl(NH_4)_2(NO_3)_6$ as an etchant.

17. The method of claim 12 wherein said first etching means uses dry etching with $Cl_2+O_2$ as an etchant.

18. The method of claim 12 wherein said second etching means uses dry anisotropic etching with $CF_4+O_2$ or $CHF_3+$He as an etchant.

19. The method of claim 12 wherein said third etching means uses $O_2$ plasma dry anisotropic etching.

20. The method of claim 12 wherein said fourth etching means uses wet etching with $(HClO_4/Cl(NH_4)_2(NO_3)_6$ as an etchant.

21. The method of claim 12 wherein said fourth etching means uses dry etching with $Cl_2+O_2$ as an etchant.

\* \* \* \* \*